(12) United States Patent
Kang et al.

(10) Patent No.: US 9,893,401 B2
(45) Date of Patent: Feb. 13, 2018

(54) EFFECTIVE BIASING ACTIVE CIRCULATOR WITH RF CHOKE CONCEPT

(71) Applicant: HRL Laboratories, LLC, Malibu, CA (US)

(72) Inventors: Jongchan Kang, Moorpark, CA (US); Hasan Sharifi, Agoura Hills, CA (US); Eric M. Prophet, Santa Barbara, CA (US)

(73) Assignee: HRL Laboratories, LLC, Malibu, CA (US)

( * ) Notice: Subject to any disclaimer, the term of this patent is extended or adjusted under 35 U.S.C. 154(b) by 271 days.

(21) Appl. No.: 14/554,995

(22) Filed: Nov. 26, 2014

(65) Prior Publication Data

US 2016/0149558 A1    May 26, 2016

(51) Int. Cl.
*H01P 1/383* (2006.01)
*H03H 11/38* (2006.01)

(52) U.S. Cl.
CPC ............. *H01P 1/383* (2013.01); *H03H 11/38* (2013.01)

(58) Field of Classification Search
CPC . H01P 1/38; H01P 1/383; H01P 1/387; H03H 11/38
USPC ...................................................... 333/1, 1.1
See application file for complete search history.

(56) References Cited

U.S. PATENT DOCUMENTS

| | | | |
|---|---|---|---|
| 3,860,893 A | 1/1975 | Ropars | |
| 4,908,531 A | 3/1990 | Podell | |
| 5,101,179 A | 3/1992 | Jarrett et al. | |
| 5,144,266 A | 9/1992 | Dougherty et al. | |
| 8,044,733 B1 * | 10/2011 | Arora | H03B 5/1243 331/117 FE |
| 2006/0087376 A1 | 4/2006 | Young et al. | |
| 2007/0182483 A1 * | 8/2007 | Seyfried | H03F 1/30 330/127 |
| 2013/0147535 A1 | 6/2013 | Hur et al. | |
| 2013/0169367 A1 | 7/2013 | Vickes et al. | |
| 2016/0149558 A1 | 5/2016 | Kang | |

OTHER PUBLICATIONS

Tanaka et al., "Active Circulators—The Realization of Circulators using Transistors," Proceeding of the IEEE, vol. 53, Issue: 3, pp. 260-267, (Mar. 1965).

(Continued)

*Primary Examiner* — Robert J Pascal
*Assistant Examiner* — Jorge Salazar, Jr.
(74) *Attorney, Agent, or Firm* — Ladas & Parry (57) ABSTRACT

A multi-port active circulator where each of a plurality of FET transistors has (i) a gate connected to an associated port of the multi-port active circulator via a capacitor of an associated one of a plurality of first RF chokes, each of the first RF chokes being connected to a gate of an associated FET transistor of said plurality of transistors, the associated port of said associated FET transistor and to a power supply bias connection; (ii) a source connected to a common point; and (iii) a drain connected to the gate of the same FET transistor by a feedback circuit and connected to the gate of a neighboring FET transistor via a capacitor of one of a plurality of second RF chokes, each of which coupling gates and drains of neighboring FET transistors via capacitors thereof and being connected to another power supply bias connection.

28 Claims, 9 Drawing Sheets

(56) References Cited

OTHER PUBLICATIONS

Shin et al. "A 1.5-9.6 GHz Monolithic Active Quasi-Circulator in 0.18 urn CMOS Technology," IEEE Microwave and Wireless Components letters, vol. 18, No. 12, pp. 797-799, (Dec. 2008).
Smith, Mark A., "GaAs Monolithic Implementation of Active Circulators," IEEE Microwave Symposium, pp. 1015-1016 (1988).
International Search Report & Written Opinion for PCT/US2014/067742 dated Jul. 30, 2015.
U.S. Appl. No. 14/949,044, filed Nov. 23, 2015, Kang.
From U.S. Appl. No. 14/949,044 (unpublished, non-publication request filed), Office Action dated Sep. 14, 2016.
From U.S. Appl. No. 14/949,044 (unpublished, non-publication request filed), Notice of Allowance dated Dec. 30, 2016.
PCT International Preliminary Report on Patentability (Chapter II) from PCT/US2014/067742 dated Jan. 18, 2017.

\* cited by examiner

Fig. 5 Simulation Results of the new Active Circulator disc

Fig. 4 Simulation Results of Typical Prior Art Active Circulator

Fig. 10

EFFECTIVE BIASING ACTIVE CIRCULATOR WITH RF CHOKE CONCEPT

STATEMENT REGARDING FEDERALLY SPONSORED RESEARCH OR DEVELOPMENT

This invention was made under US Government Contact No N00014-11-C-0025 and therefore the US Government may have certain rights in this invention.

CROSS REFERENCE TO RELATED APPLICATIONS

None.

TECHNICAL FIELD

This invention relates to active circulators.

BACKGROUND

Circulators are well known in the prior art. A circulator is an active or passive three- or four-port device, in which a microwave or radio frequency signal entering any port is transmitted only to the next port in rotation.

Figure 1:
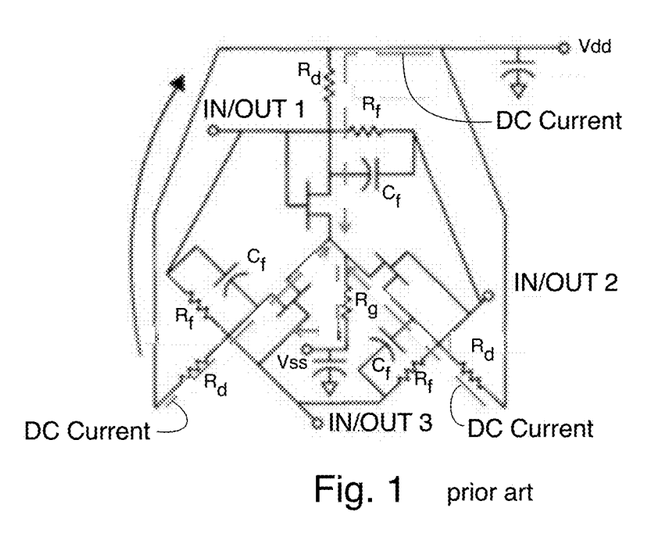
FIG. 1 depicts a three port prior art active circulator.

FIG. 1 shows a prior art three port active circulator. The port numbers are labeled and as can be seen the direction of rotation (referred to in the immediately preceding paragraph) is counter clockwise. In this prior art circulator the drain bias voltages (Vdd) are directly connected to three drain resistors $R_d$. So the drain currents flow thought the three drain resistors and they are grounded to Vss through common ground resistor $R_g$. In this configuration, there are significant voltage drops through the various resistors causing DC power consumption to occur and DC power consumption is certainly not desirable in an energy efficient system if it cannot be avoided.

Typically, in active circulators, each drain resistor $R_d$ takes a high value in order to block RF signal and the common ground resistor $R_g$ is also not of a small value for the same reason. Otherwise, even more significant RF power loss will occur across the drain resistors $R_d$ and common ground resistor $R_g$. Beside DC and RF power loss, the DC voltage drop across the $R_d$ and common ground resistor $R_g$ also limit maximum RF voltage swing across each FET transistor, since applied DC voltage across each FET transistor is reduced by the voltage drop across these resistors. Limiting the RF voltage swing leads to a limitation on the maximum circulator power handling capability. In this prior art configuration, the drain bias voltages (Vdd) are directly connected to the drain resistors so the drain current flow is through the drain resistors $R_d$ and it is grounded through the common ground resistor $R_g$. Thus there are significant voltage drops through the resistors causing DC power consumption, which is not desirable in an energy efficient system.

Also in FIG. 1 there are three other resistors $R_f$ (bypassed with the capacitors $C_f$) which form RF feedback networks. These RF feedback networks are typically used in an active circulator in order to adjust transconductance of the FETs. Through this resistor and capacitor network, there is preferably no DC current flowing, so it should not produce a DC power loss. The resistance value of $R_f$ is usually high, so very small RF power is fed-backed from drain so gate, not producing a significant RF power loss either. The feed-back capacitor $C_f$ is very big, to it is functions as a RF bypass capacitor with DC blocking. It controls each FETs RF trans-conductance. Active circulator operation is very sensitive to RF transconductance and depending on transconductance, loss and isolation varies.

So if the prior art drain resistors $R_d$ and common ground resistor $R_g$ of FIG. 1 could be eliminated, then the circulator might (1) handle more power and (2) do so in a more energy efficient manner.

Circulators have numerous uses. For example, one port of a three port circulator may be connected to an antenna, while a receiver is connected to a second port of the circulator to receive signals received by the antenna and with a transmitter connected to a third port of the circulator to supply transmit signals to the antenna (with the transmit signals being isolated by the circulator from the receiver which might otherwise be damaged by those transmit signals).

The prior art includes: (i) "Active Circulators—The Realization of Circulators using Transistors" S. Tanaka, N. Shimomura, K. Ohtake, Proceeding of the IEEE, March. Vol. 53, Issue: 3, pages: 260-267, 1965; (ii) "A 1.5-9.6 GHz Monolithic Active Quasi-Circulator in 0.18 um CMOS Technology" Shih-Chieh Shin, Jhih-Yu Huang, Kun You Lin and Huei Wang, IEEE Microwave and Wireless Components letters, Vol. 18, No 12 Dec. 2008; and (iii) "GaAs Monolithic Implementation of Active Circulator", Mark A. Smith, IEEE Microwave Symposium 1988.

BRIEF DESCRIPTION OF THE INVENTION

In one aspect the present invention relates to an active circulator where the DC and RF paths are sufficiently separated to provide maximum RF voltage swing without generating DC power consumption through resistors and RF power loss through those resistors. DC power consumption will occur in biasing the active devices (the transistors) and cannot be entirely avoided, but the AC signals need to travel on pathways which avoid DC power consuming resistors used to bias the active devices (the transistors).

In another aspect the present invention relates to a multi-port active circulator comprising: a plurality of transistors, a plurality of first RF chokes and a plurality of second RF chokes, where each of transistor of said plurality having: (i) a control electrode connected to an associated port of said multi-port active circulator via a capacitor of an associated one of said first RF chokes, each of said first RF chokes being connected to a control electrode of an associated transistor of said plurality of transistors, the associated port of said associated transistor and to a first power supply connection; (ii) a first current carrying electrode connected to a common point; and (iii) a second current carrying electrode connected to the control electrode of the same transistor by a feedback circuit and connected to the control electrode of a neighboring transistor via a capacitor of one of the second RF chokes, each of the second RF chokes coupling control electrodes and second current carrying electrodes of neighboring transistors via the capacitors thereof and each of the second RF chokes being connected to a second power supply connection; and said common point being connected by circuit means to a third power supply connection.

In yet another aspect the present invention provides an apparatus for biasing active devices in an active circulator comprising means separating a DC bias circuit path and an RF signal path sufficiently to provide a maximum RF voltage swing without providing any resistors in said DC bias circuit path thereby inhibiting DC power consumption through resistors.

In still yet another aspect the present invention provides an apparatus for biasing FET transistors in an active circulator comprising means separating a DC bias circuit path and an RF signal path between said FET transistors sufficiently to provide a maximum RF voltage swing across the drains and sources of said FET transistors without providing any resistors in said RF signal path between said FET transistors thereby inhibiting resistive power consumption.

And in yet another aspect the present invention provides an apparatus for signal injecting and biasing a plurality of transistors arranged in a ring in a multi-port circulator, said apparatus comprising means applying the signal being injected via a separate capacitor coupled with each control electrode of said plurality of transistors in said ring and applying a first bias voltage or current via a separate inductor coupled with each control electrode of said plurality of transistors in said ring.

DETAILED DESCRIPTION

Figure 2:
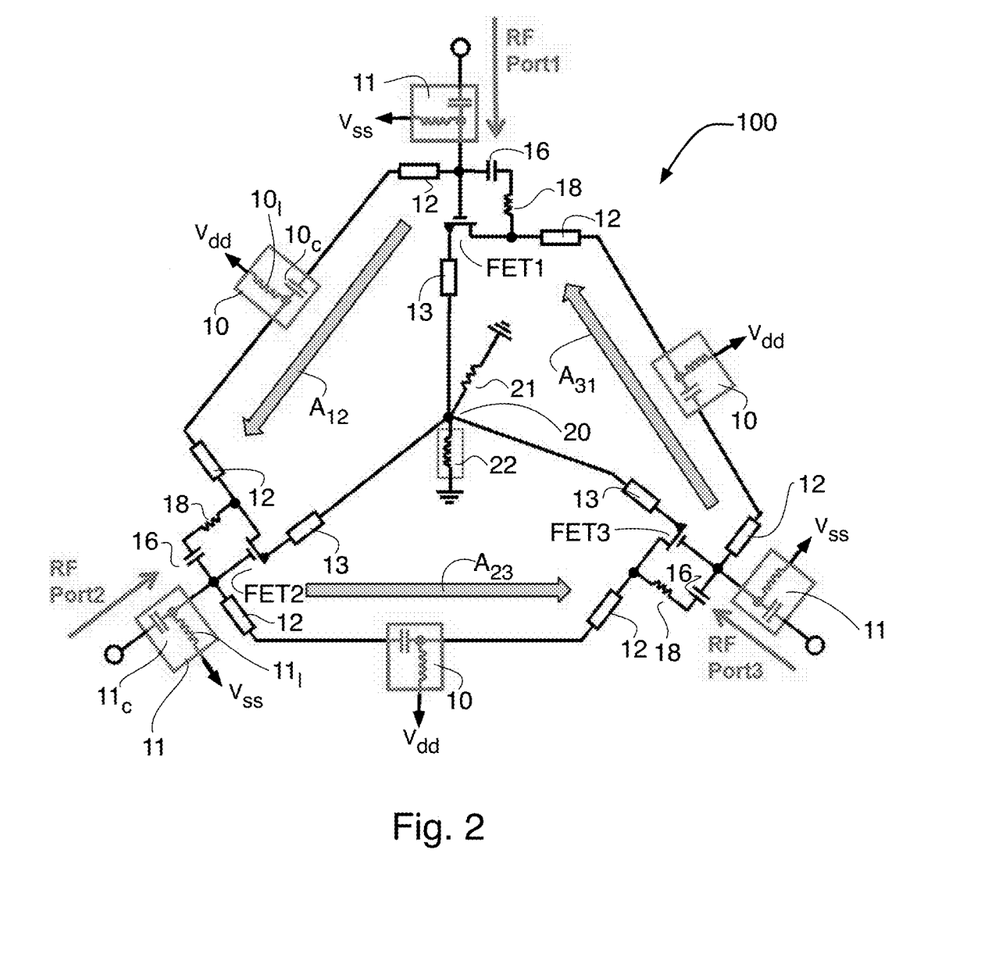
FIG. 2 depicts a schematic diagram of a three port active circulator in accordance with the present invention.

FIG. 2 depicts a schematic diagram of the new active circulator 100. Basically active circulator consists of three (or more) transistors (FET1, FET2 and FET3) arranged in a ring, with RC feedback and common ground resistors. The gate bias (to $V_{ss}$) of the each of the three transistors FET1, FET2 and FET3 is provided through one of three choke inductors $11_I$ (inside each of three RF chokes 11), while the drain bias (to Vdd) of the each of the three transistors FET1, FET2 and FET3 is provided through one of three choke inductors 101 (inside each of three RF chokes 10). The three transistors FET1, FET2 and FET3 are depicted (according to the symbol used) as being HEMT devices, but the three transistors FET1, FET2 and FET3 can be implemented as other types of transistors including Bipolar Junction Transistors, CMOS Field Effect Transistors, and Laterally Diffused Metal Oxide Semiconductor Transistors, to name a few. So the use of nomenclature "FET" with respect to transistors FET1, FET2 and FET3 does not exclude the use of other types of transistors as FET1, FET2 and FET3. However, if a FET-type transistor (HEMT, LDMOS, CMOS, etc.) is utilized as transistors FET1, FET2 and FET3, then the three choke inductors $11_I$ (inside each of three RF chokes 11) can replaced with high resistance resistors, since FET type devices do not draw a bias current at their gates. And three resistors $11_I$ would be easier to implement than would be a conventional inductor if the new active circulator were implemented as monolithic microwave integrated circuit (MMIC). However, if bipolar transistors were used instead of FETs to implement this invention, then replacing the three choke inductors $11_I$ with high resistance resistors would lead to some DC power loss.

Each of the three RF signals for the circulator 100 are applied at the three ports (RF Port1, RF Port2, RF Port2) and are each introduced through a bypass capacitor $11_c$ in each of the RF chokes 11. For a monolithic microwave integrated circuit (MMIC) embodiment, each choke inductor $11_I$ to $V_{ss}$ can be replaced with a high resistance resistor (as mentioned above, particularly if FET-type transistors are used as transistors FET1, FET2 and FET3) and each bypass capacitor $11_c$ can be implemented as a highly capacitive capacitance (the capacitance of which is preferably sufficiently large to pass the signal with as little loss as reasonable given the fact that impedance of inductor/resistor should be much greater than the impedance of the capacitor at the frequency of the RF signal at Port1, Port2 or Port3). Alternatively, choke inductors $11_I$ can be replaced with shorted λ/4 (quarter wave length) transmission line stub or with an active load. Similarly, choke inductors $10_I$ can be replaced with shorted λ/4 (quarter wave length) transmission line stub or with an impedance convertor.

The RF chokes 10, 11 are each depicted as a simple LC choke. More complex choke designs (and even simpler choke designs) may be substituted therefor so long as (i) in the case of RF chokes 11, the bias voltage ($V_{ss}$ in this embodiment) has a DC path to the gate of the particular transistor (FET1, FET2 or FET3) to which it applies a bias voltage or (ii) in the case of RF chokes 10, the bias voltage (Vdd in this embodiment) has a DC path to the drain of the particular transistor (FET1, FET2 or FET3) to which it applies a bias voltage. Only one of the three RF chokes 11 has its internal capacitor $11_c$ and inductor (or resistor) $11_I$ labeled as such for ease of illustration, it being understood that the other two chokes 11 should be considered as having their internal capacitor and inductor labeled in the same way and that the internal inductor may be implemented as a resistor, stub or impedance convertor as mentioned above. Similarly, only one of the three RF chokes 10 has its internal capacitor $10_c$ and inductor $10_I$ labeled as such for ease of illustration, it being understood that the other two chokes 10 should be considered as having their internal capacitor and inductor labeled in the same way and that the internal inductor may be implemented as a stub or impedance convertor.

Figure 3:
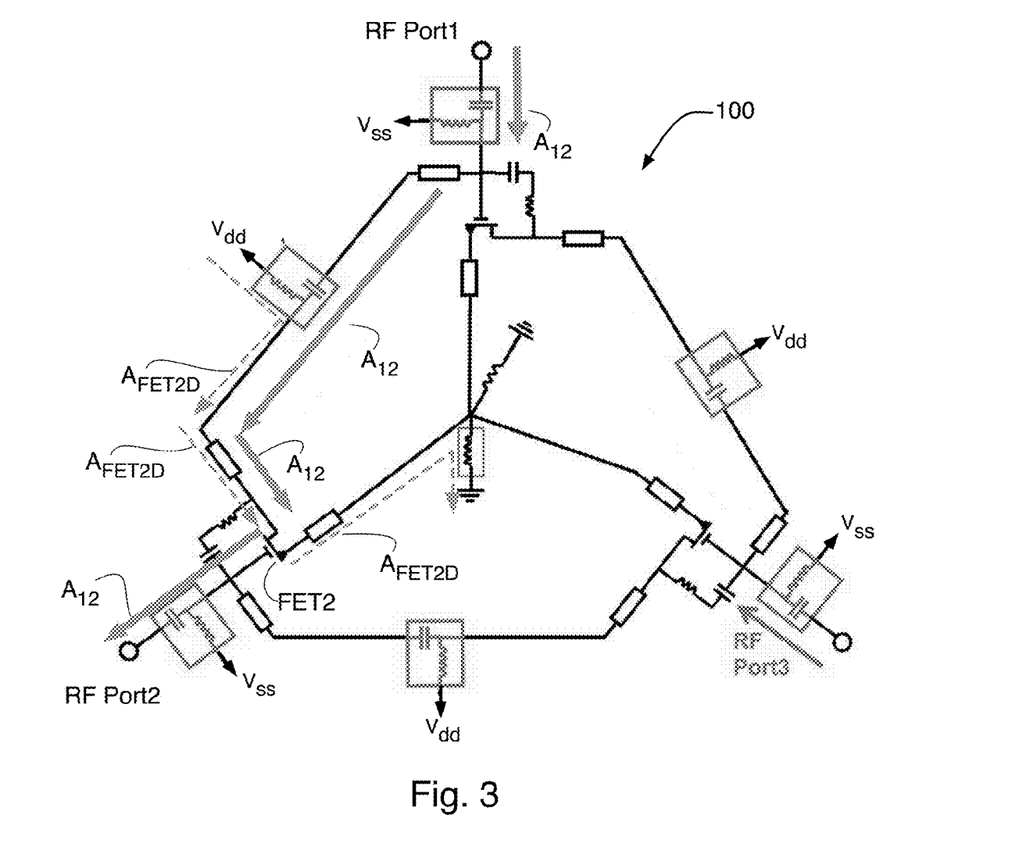
FIG. 3 depicts a diagram of a three port active circulator similar to FIG. 2 but with RF and DC signal lines indicated for a RF Port1 and RF Port2 transfer of RF energy.

After the RF signal is applied at a port and the transistor whose gate (or control electrode in case a non-FET type transistor is utilized) is directly coupled to the output of the choke at the same gate, the RF signal is sent to the next gate and output there is as usually done in the circulator art. FIG. 2 should now be considered in tandem with FIG. 3. In FIG. 2 an RF signal applied for example at RF Port1 will emerge at RF Port2 but be isolated from RF Port3 (so the direction of rotation is also counterclockwise in these figures). The RF signal path from RF Port1 to RF Port2 is denoted by arrow $A_{12}$. Similarly, the RF signal path from RF Port2 to RF Port3 is denoted by arrow $A_{23}$ and the RF signal path from RF Port3 and RF Port1 is denoted by arrow $A_{31}$. A more complete showing of the RF signal path from RF Port1 to RF Post 2 is shown in FIG. 3 with additional heavy arrows also labeled $A_{12}$.

The RF signal paths are shown with elements 12 in those paths. Elements 12 merely denote that those paths are preferable either entirely or partially formed as a microstrip, so the depicted conductors in the RF signal path A12 connecting the output of choke 11 (which is also connected to the gate of FET1) to the drain of FET2 are preferably implemented as microstrips, particularly if the disclosed active circulator is embodied as a MMIC where those conductors would be spaced from an underlying ground plate (not shown) by a dielectric layer (also not shown) formed as a part of the MMIC.

The sources of the transistors FET1, FET2 and FET3 are each connected by conductor to a central junction point 20, each such conductor being preferably implemented as a microstrip 13 as discussed above with reference to microstrips 12. The central junction point 20 is coupled to DC ground preferably via a parallel arrangement of a resistor 21 and an inductor 22.

Resistors 18 and capacitors 16 provide a feedback path similarly to the resistors $R_f$ and capacitors $C_f$ of FIG. 1 and for normal values thereof they do not produce any DC loss or significant RF loss. In some embodiments it may be useful to arrange resistors 18 and capacitors 16 in a parallel arrangement as opposed to the series arrangement shown in FIG. 2. Nevertheless, the depicted series arrangement is believed to be superior in order to separate the drain bias voltage (to $V_{dd}$ in the embodiment of FIG. 2) from the gate bias voltage (to $V_{ss}$ in the embodiment of FIG. 2).

The drain current is provided from $V_{dd}$ through the choke inductor of RF choke 10, and grounded through the common ground choke inductor 22 at common point 20. These choke inductors in RF chokes 10, 11 completely choke RF signal at both of drain and source, effectively delivering DC current without DC loss. Furthermore, 100% of $V_{dd}$ is preferably applied to the nodes between each FET transistor's drain and source, so the RF voltage swing can be maximized and corresponding RF delivering power can be maximized as well.

Even though it is not shown in the FIG. 2, three small value resistors (typically less than 5 ohms each) can be added between the sources of the FETs and the common junction (at numeral 13). This is for the circulator stability and corresponding DC and RF power loss through these resistors should be negligible.

Figure 4:
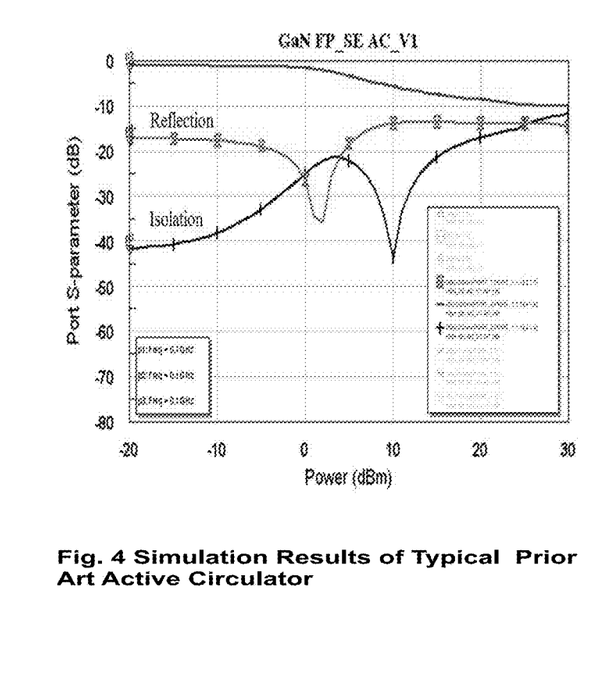
FIG. 4 shows the simulation results of a typical prior art active circulator which assumes FIG. 1 circuit topology.
Figure 5:
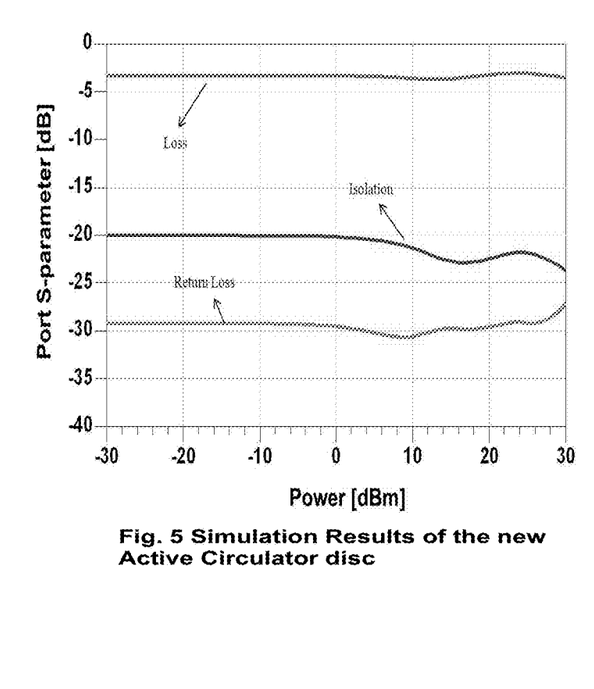
FIG. 5 shows the simulation results of an active circulator which assumes FIG. 2 circuit topology of this invention.

To demonstrate the superiority of this invention over the prior art, simulation result comparisons are provided in FIGS. 4 and 5. FIG. 4 shows the simulation result of typical prior art active circulator which takes FIG. 1 topology and FIG. 5 shows the new circulator of FIGS. 2 and 3. Both of the simulations assume that the same n-channel depletion type GaN HEMT is used for the transistors and used designs optimized to maximize power handling capability while maintaining good isolation and insertion loss as much as reasonably possible. From FIG. 4, the insertion loss begins to drop around 0 dBm input driving power and isolation gets worse than 20 dB from 15 dBm input driving power. But, in FIG. 5, with the new active circulator disclosed herein being simulated, it maintains good insertion loss and isolation by less than 4 dB and 20 dB each up to 30 dBm input driving power. The much higher maximum power handling capability of the new active circulator disclosed herein is due to the advantage mentioned above. Based on these simulations it is believed that the circulator disclosed herein is a significant improvement over the prior art.

Figure 6:
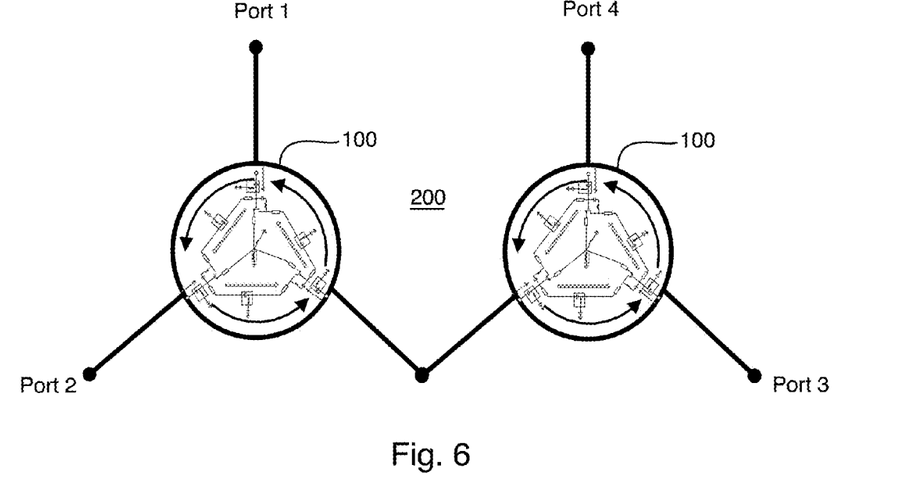
FIGS. 6, 7 and 8 respectively show four, five and N port embodiments of circulators using the three port embodiment of FIGS. 2 and 3 as a basic building block therefor.
Figure 7:
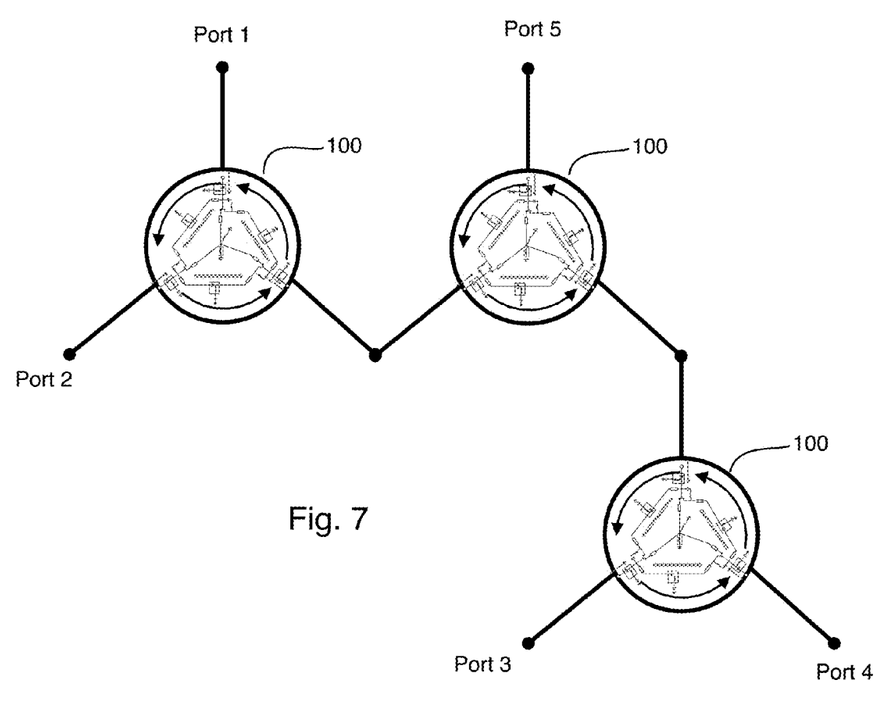
Figure 8:
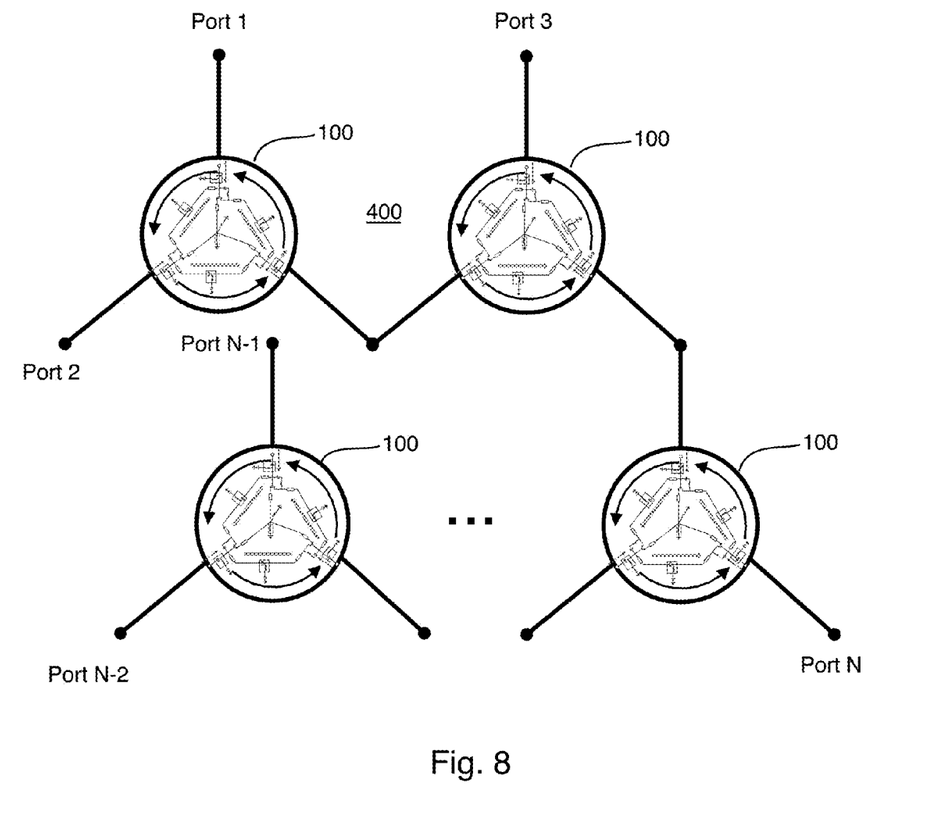

The three port circulator 100 described with reference to FIGS. 2 and 3 can be utilized as a building block to make a four port circulator 200 as shown by FIG. 6, or a five port circulator 300 as shown by FIG. 7 or indeed an N-port circulator 400 as shown by FIG. 8.

Figure 9:
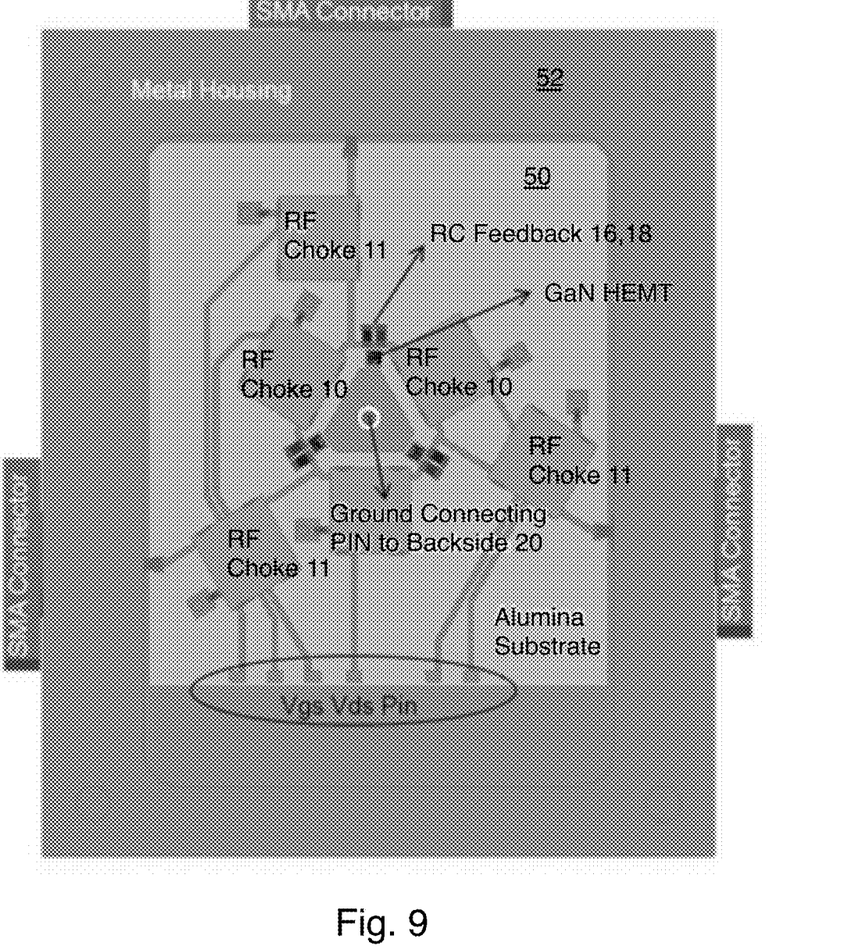
FIG. 9 is an assembly diagram of an embodiment of the active circulator disclosed herein.
Figure 10:
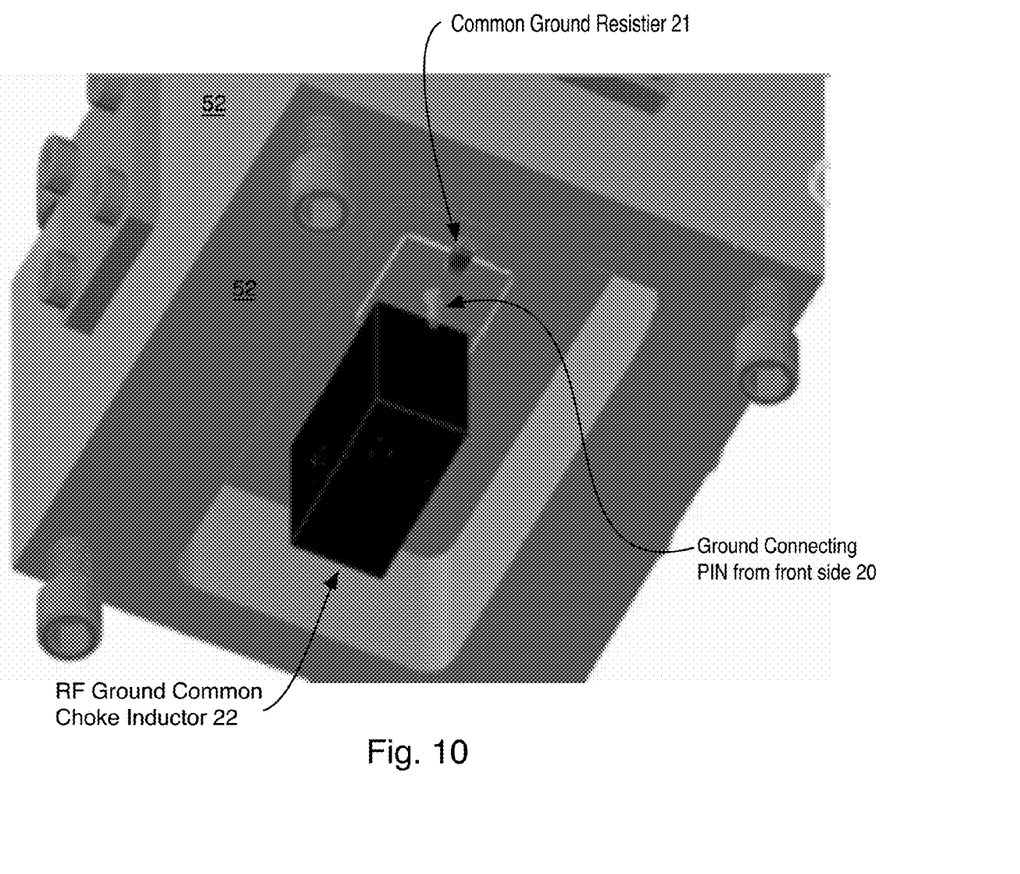
FIG. 10 is an assembly diagram of a back side view of the embodiment of the active circulator of FIG. 9.

FIG. 9 is an assembly diagram showing one possible way or embodiment of assembling the new active circulator disclosed herein. FIG. 10 is an assembly diagram of a back side view of the embodiment of the active circulator of FIG. 9. In this embodiment, the circuit of the new circulator of FIGS. 2 and 3 is preferably disposed on an alumina substrate 50 which is in turn is preferably disposed in a metal housing 52. The ports RF Port1-RF Port3 are respectively wired up to three individual SMA connectors disposed on housing 52. The individual devices and RF Chokes 10, 11 are implemented as discrete lumped components in this embodiment. Basically, this alumina substrate 50 accommodates a hybrid configuration, meaning that this embodiment is not require a single MMIC, but rather preferably utilizes a combination of a semiconductor circuit (for the three transistors FET1, FET2 and FET3) and discrete devices and lumped components. The discrete devices and lumped components are mounted on the alumina substrate 50 and the alumina substrate 50 preferably assumes a pattern designed to receive the pads of the lumped component from all of the RF microstrips 12, 14 and DC power routing lines shown in FIGS. 2 and 3. The three transistors (FET1, FET2 and FET3) preferably have GaN HEMT cores that are formed as the aforementioned semiconductor circuit that is also mounted on substrate 50. The RC feed back elements 16, 18 are shown and preferably are realized with type 0402 surface mountable resistors and capacitors. For RF chokes 10, 11 these may be realized with Mini-Circuit's low loss chokes (a broadband bias choke is preferably selected such as model TCBT-14+) and for the common ground choke inductor 22 a Coil Craft conical inductor may be utilized. Since there may not enough space to mount common ground inductor 22 and resistor 21 at the center of the active circulator in this embodiment, the source of each FET transistor may be lead to the back side ground plane with a coaxial conductor 22 (so the common point of FIG. 2 is implemented in part by a coaxial conductor in this embodiment) as shown in FIGS. 9 and 10. In this way, the common ground choke inductor 22 and resistor 21 may be mounted on a back side of housing 52 in this embodiment.

This concludes the description of embodiments of the present invention. The foregoing description of these embodiments has been presented for the purposes of illustration and description. It is not intended to be exhaustive or to limit the invention to the precise form or methods disclosed. Many modifications and variations are possible in light of the above teachings. It is intended that the scope of the invention be limited not by this detailed description, but rather by the claims appended hereto.

What is claimed is:
1. A multi-port active circulator comprising:
 a. a plurality of FET transistors, a plurality of first RF chokes and a plurality of second RF chokes, where each of FET transistor of said plurality having:
   (i) a gate connected to an associated port of said multi-port active circulator via a capacitor of an associated one of said plurality of first RF chokes, each of said plurality of first RF chokes being connected to a gate of an associated FET transistor of said plurality of transistors, the associated port of said associated FET transistor and to a first power supply connection;
   (ii) a source connected to a common point; and
   (iii) a drain connected to the gate of the same FET transistor by a feedback circuit and connected to the gate of a neighboring FET transistor via a capacitor of one of the plurality of second RF chokes, each of the plurality of second RF chokes coupling gates and drains of neighboring FET transistors via the capaci- tors thereof and each of the plurality of second RF chokes being connected to a second power supply connection;

b. said common point being connected by circuit means to a third power supply connection.

2. A multi-port active circulator comprising: a plurality of transistors arranged in a ring, each transistor in said ring having a first electrode coupled with a port of said multi-port active circulator via one of a first plurality of RF chokes, each RF choke of said first plurality of RF chokes having means for applying a bias voltage or current to the first electrode with which it is connected, each transistor in said ring having a second electrode coupled in common at a common point with all other second electrodes of said plurality of transistors, and each transistor in said ring having a third electrode coupled via one of a plurality of feedback circuits with the first electrode thereof and coupled with the first electrode of a neighboring transistor in said ring via one of a second plurality of RF chokes, each choke of said second plurality of RF chokes having means for applying a bias voltage or current to said third electrode, the bias voltages or currents applied via said first and second pluralities of RF chokes being in electrical communication with ground via said common point.

3. The multi-port active circulator of claim 2 wherein each transistor of said plurality of transistors is an FET and wherein each said first electrode is a gate electrode, each said second electrode is a source electrode and each said third electrode is a drain electrode.

4. The multi-port active circulator of claim 2 wherein the means for applying a bias voltage or current to the first electrode of each transistor comprises an inductor of each RF choke of said first plurality of RF chokes.

5. The multi-port active circulator of claim 2 wherein the means for applying a bias voltage or current to the third electrode of each transistor comprises an inductor of each RF choke of said second plurality of RF chokes.

6. The multi-port active circulator of claim 2 wherein the means for applying a bias voltage or current to the first electrode of each transistor comprises a resistor of each RF choke of said first plurality of RF chokes.

7. The multi-port active circulator of claim 2 wherein the means for applying a bias voltage or current to the third electrode of each transistor comprises a resistor of each RF choke of said second plurality of RF chokes.

8. The multi-port active circulator of claim 2 wherein each of said feedback circuits in said plurality thereof comprises an capacitor and a resistor connected in series.

9. Apparatus for biasing active devices in an active circulator comprising means separating a DC bias circuit path and an RF signal path sufficiently to provide a maximum RF voltage swing without providing any resistors in said DC bias circuit path to bias said active devices.

10. Apparatus for biasing FET transistors in an active circulator comprising means separating a DC bias circuit path connected to gates of said FET transistors and an RF signal path between said FET transistors sufficiently to provide a maximum RF voltage swing across the drains and sources of said FET transistors without providing any resistors in said RF signal path between said FET transistors thereby inhibiting resistive power consumption.

11. Apparatus for signal injecting and biasing a plurality of transistors arranged in a ring in a multi-port circulator, said apparatus comprising means applying the signal being injected via a separate capacitor coupled with each control electrode of said plurality of transistors in said ring and applying a first bias voltage or current via a separate inductor coupled with each control electrode of said plurality of transistors in said ring.

12. The apparatus of claim 11 wherein said transistors are FET transistors and wherein the control electrode is a gate of said FET transistors.

13. The apparatus of claim 12 wherein said FET transistors are depletion mode HEMT transistors.

14. The apparatus of claim 12 further including means connecting the gates of each of said plurality of FETs in said ring with a drain of another one of the FETs in said ring via another separate capacitor and means applying a second bias voltage or current via another separate inductor coupled with the drains of each of said plurality of FETs in said ring.

15. The apparatus of claim 14 further including means connecting the gate and the drain of each of said plurality of FETs in said ring via a feedback circuit comprising a resistor and a capacitor coupled in series.

16. A multi-port active circulator comprising:

a. a plurality of transistors arranged in a ring with a plurality of first RF chokes and a plurality of second RF chokes, where each of transistor of said plurality having:

(i) a control electrode connected with an associated port of said multi-port active circulator via a capacitor of an associated one of said first RF chokes, each of said first RF chokes being connected to a control electrode of an associated transistor of said plurality of transistors, the associated port of said associated transistor and to a first power supply connection;

(ii) a first current carrying electrode connected to a common point; and (iii) a second current carrying electrode connected to the control electrode of the same transistor by a feedback circuit and connected to the control electrode of a neighboring transistor via a capacitor of one of the second RF chokes, each of the second RF chokes coupling control electrodes and second current carrying electrodes of neighboring transistors via the capacitors thereof and each of the second RF chokes being connected to a second power supply connection;

b. said common point being connected with a third power supply connection.

17. The multi-port active circulator of claim 16 wherein each of said transistors is a HEMT.

18. The multi-port active circulator of claim 16 wherein the multi-port active circulator is used as a building block to form a multi-port active circulator having an even greater number of ports than the multi-port active circulator of claim 16.

19. An apparatus for signal injecting and biasing a plurality of field effect transistors arranged in a ring in a multi-port circulator having a plurality of ports for receiving signals to be injected, said apparatus comprising a first plurality of capacitors and a first plurality of inductors, each one of said first plurality of capacitors connecting a gate of one of said field effect transistors in said ring circuit with a corresponding one of said ports and each one of said first plurality of inductors being connected to the gate of one of said field effect transistors in said ring for applying a first bias voltage to that gate.

20. The apparatus of claim 19 further including a second plurality of capacitors and a second plurality of inductors, each one of the second plurality of capacitors connecting the gate of one of said plurality of said field effect transistors in said ring with a drain of another one of the field effect transistors in said ring and the second plurality of inductors connecting a second bias voltage to the drains of each one of said field effect transistors in said ring.

21. The apparatus of claim 20 wherein the first bias voltage is $V_{ss}$ and the second bias voltage is $V_{dd}$.

22. The apparatus of claim 21 wherein a single inductor connects a source of each one of the plurality of said field effect transistors to a ground potential.

23. The apparatus of claim 20 further including a third plurality of capacitors, each one of the capacitors in said third plurality of capacitors connecting the gate of one of the field effect transistors in said ring with the drain of said one of the field effect transistors in said ring.

24. An apparatus for signal injecting and biasing a plurality of field effect transistors arranged in a ring in a multi-port circulator having a plurality of ports for receiving signals to be injected, said apparatus comprising a first plurality of capacitors and a first plurality of resistors, each one of said first plurality of capacitors connecting a gate of one of said field effect transistor in said ring circuit with a corresponding one of said ports and each one of said first plurality of resistors being connected to the gate of one of field effect transistor in said ring for applying a first bias voltage to that gate.

25. The apparatus of claim 24 further including a second plurality of capacitors and a first plurality of inductors, the second plurality of capacitors connecting the gates of each one of said plurality of said field effect transistors in said ring with a drain of another one of the field effect transistors in said ring and the first plurality of inductors connecting a second bias voltage to the drains of each one of said field effect transistors in said ring.

26. The apparatus of claim 25 wherein the first bias voltage is $V_{ss}$ and the second bias voltage is $V_{dd}$.

27. The apparatus of claim 26 wherein a single inductor connects a source of each one of the plurality of said field effect transistors to a ground potential.

28. The apparatus of claim 25 further including a third plurality of capacitors, each one of the capacitors in said third plurality of capacitors connecting the gate of one of the field effect transistors in said ring with the drain of said one of the field effect transistors in said ring.

* * * * *